(12) United States Patent
Seol et al.

(10) Patent No.: US 10,591,226 B2
(45) Date of Patent: Mar. 17, 2020

(54) HEAT TRANSFER DEVICE

(71) Applicant: GWANGJU INSTITUTE OF SCIENCE AND TECHNOLOGY, Gwangju (KR)

(72) Inventors: Jae Hun Seol, Gwangju (KR); Jun Kyu Han, Gwangju (KR); Hyun Woo Kim, Gwangju (KR); Myung Ill You, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 203 days.

(21) Appl. No.: 15/607,315

(22) Filed: May 26, 2017

(65) Prior Publication Data

US 2017/0363370 A1 Dec. 21, 2017

(30) Foreign Application Priority Data

May 27, 2016 (KR) ........................ 10-2016-0065670

(51) Int. Cl.
*F28F 3/02* (2006.01)
*B60N 2/56* (2006.01)
*H01L 23/373* (2006.01)

(52) U.S. Cl.
CPC ............ *F28F 3/022* (2013.01); *B60N 2/5678* (2013.01); *B60N 2/56* (2013.01); *H01L 23/3733* (2013.01)

(58) Field of Classification Search
CPC .... F28F 3/022; F28F 3/02; F28F 13/00; F28F 23/00; B60N 2/5678; B60N 2/56; H01L 23/3733; H01L 23/3672; H01L 23/46; A47C 21/048; A47G 9/0215; A61F 7/0097; H05B 3/342; H05B 3/345; H05B 3/347;
(Continued)

(56) References Cited

FOREIGN PATENT DOCUMENTS

| JP | 2005143729 A1 | * 11/2003 |
| JP | 2005143729 A | 6/2005 |

(Continued)

OTHER PUBLICATIONS

Rodney, Gadot, Martinez, Rolland Du Roscoat, Orgeas; Reversible Dilatancy in Entangled Single-Wire Materials; Nature Materials; Jan. 2016; pp. 72-78; vol. 15; Macmillan Publishers Limited.

*Primary Examiner* — Justin M Jonaitis
(74) *Attorney, Agent, or Firm* — Steven M. Greenberg, Esq.; Shutts & Bowen LLP

(57) ABSTRACT

An embodiment relates to a heat transfer device including a heat generating device configured to generate heat having predetermined intensity by a user, a cover in contact with a body of the user while covering the heat generating device, and a heat transfer medium provided between the heat generating device and the cover to transfer the heat generated by the heat generating device, wherein the heat transfer medium is a structure that is formed by entangling a single wire having a predetermined length and has a predetermined width and a predetermined height, and is a structure that is compressed in an axial direction when being in contact with the body of the user and thus has a Poisson's ratio of 0.5 or higher. Thus, a structural change in the heat generating device is not required and only a material in contact with the heat generating device is changed, so that generated heat may more rapidly reach the body of the user.

7 Claims, 13 Drawing Sheets

(58) Field of Classification Search
CPC ............ H05B 2206/046; H05B 3/0004; B61D 27/00; B60H 1/00007
USPC .... 165/185, 41, 42; 219/212, 211, 200, 529, 219/549
See application file for complete search history.

(56) References Cited

FOREIGN PATENT DOCUMENTS

| | | |
|---|---|---|
| KR | 200415717 | 5/2006 |
| WO | 2006028032 A1 | 3/2006 |

\* cited by examiner

HEAT TRANSFER DEVICE

CROSS-REFERENCE TO RELATED APPLICATIONS

This application claims priority under 35 U.S.C. 119 and 35 U.S.C. 365 to Korean Patent Application No. 10-2016-0065670 filed on May 27, 2016 in Korea, the entire contents of which is hereby incorporated by reference in its entirety.

BACKGROUND

The present disclosure relates to a heat transfer device and, more particularly, to a heat transfer device that performs better heat transfer at a point thereof which is in contact with a portion of a body of a user.

In the modern society, a material having a high heat transfer rate is important in terms of effective use of energy. With development of information technology (IT), an electronic material necessarily requires a heat transfer rate of a predetermined level or more to effectively control heat generated by a device due to miniaturization, integration, high efficiency and the like. To secure the heat transfer rate, various researches such as manufacturing of a novel composite material, synthesis of novel thermal conductive particles, control of structures and shapes of thermal conductive particles and control of orientation inside matrix resin as well as a complexation process for thermal conductive filler have been progressed. However, these researches have disadvantages in that a long time and high economical costs are consumed.

SUMMARY

To solve the above-described problems, an aspect of the present disclosure is to provide a heat transfer device which changes a heat transfer path of heat generated in accordance with a change in a shape by using a material having a Poisson's ratio close to 1 as a heat transfer medium.

Another aspect of the present disclosure is to provide a heat transfer device in which heat transfer is further accelerated at a point thereof which is in contact with a portion of a body of a user, making it possible to improve energy efficiency.

An embodiment of the present disclosure relates to a heat transfer device including: a heat generating device configured to generate heat having predetermined intensity by a user; a cover in contact with a body of the user while covering the heat generating device; and a heat transfer medium provided between the heat generating device and the cover to transfer the heat generated by the heat generating device, wherein the heat transfer medium is a structure that is formed by entangling a single wire having a predetermined length and has a predetermined width and a predetermined height, and is a structure that is compressed in an axial direction when being in contact with the body of the user and thus has a Poisson's ratio of 0.5 or higher.

Further, the wire constituting the heat transfer medium may be formed of any one of copper, nitinol and polymer.

Further, a plurality of heat transfer mediums may be arranged at a portion of the heat transfer device, which is in contact with the body of the user.

Further, the wire constituting the heat transfer medium may be a single wire having a diameter of 500 μm and a length of 20 m.

Further, when the heat transfer medium is compressed, the thickness of the heat transfer medium may be decreased and an area of the heat transfer medium, which is in contact with the heat generating device, may be increased.

Further, a heat transfer path at a portion of the heat transfer medium, which is compressed, may be shorter than a heat transfer path at a portion of the heat transfer medium, which is not compressed.

Further, when the heat transfer medium is tensioned, the Poisson's ratio of the heat transfer medium may be close to 0, the thickness of the heat transfer medium may be increased, and an area of the heat transfer medium, which is in contact with the heat generating device, may be decreased.

Further, when the heat transfer medium is compressed and is then decompressed, heat stored in the heat transfer medium may be maintained at a certain level while the heat transfer medium is restored to an original shape.

According to an embodiment of the present disclosure, a structural change in a heat generating device is not required and only a material which is in contact with the heat generating device is changed, so that generated heat more rapidly reaches a body of a user.

According to the embodiment of the present disclosure, even when the heat generating device generates the same amount of heat, a portion of the heat generating device, pressure of which is changed by contact with a user, is changed to a structure that may preferentially and rapidly transfer heat, so that energy efficiency at the heat transfer may be improved.

BRIEF DESCRIPTION OF THE DRAWINGS

Embodiments will be described in detail with reference to the following drawings in which like reference numerals refer to like elements, and wherein.

DETAILED DESCRIPTION OF THE EMBODIMENTS

Hereinafter, although embodiments of the present disclosure will be described in detail with reference to the accompanying drawings, the present disclosure is not restrained or limited by the embodiments of the present disclosure. In description of the present disclosure, detailed descriptions of the widely-known functions or configurations will be omitted to make the subject matter of the present disclosure clear.

FIGS. 1A-1F are views illustrating a process of manufacturing a heat transfer material that may be applied to a heat transfer device according an embodiment. A heat transfer material that may be applied to a heat transfer device according to an embodiment may be formed of a material having an entangled structure having reversible dilatancy, and characteristics of the material and a method for manufacturing the material were published in a paper (David Rodney, Benjamin Gadot, Oriol Riu Martinez, Sabine Rolland du Roscoat and Laurent Orgeas Reversible dilatancy in entangled single-wire materials) presented in 2015.

The material applied to the heat transfer device according to the embodiment particularly has a Poisson's ratio close to 1, and the method for manufacturing the same will be described below.

Figure 1A:
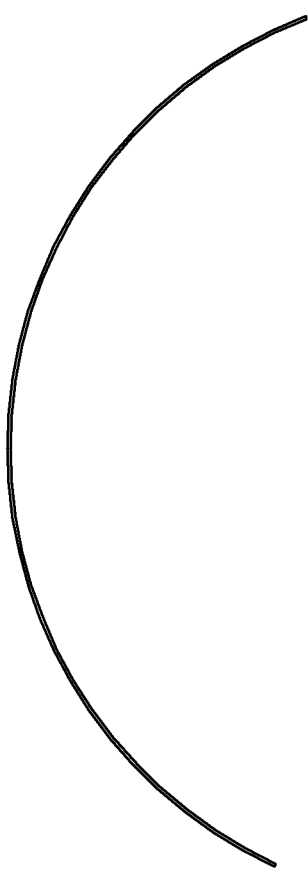
FIGS. 1A-1F are views illustrating a process of manufacturing a heat transfer material that may be applied to a heat transfer device according an embodiment.
Figure 1B:
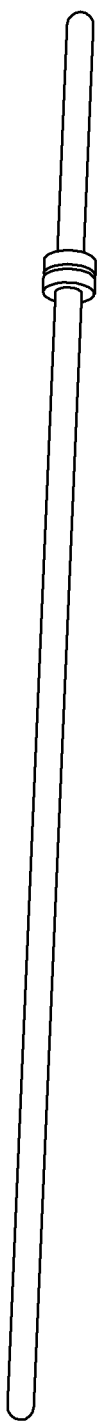
Figure 1C:
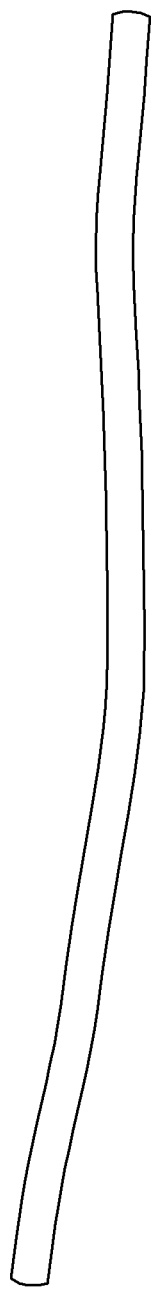
Figure 1D:
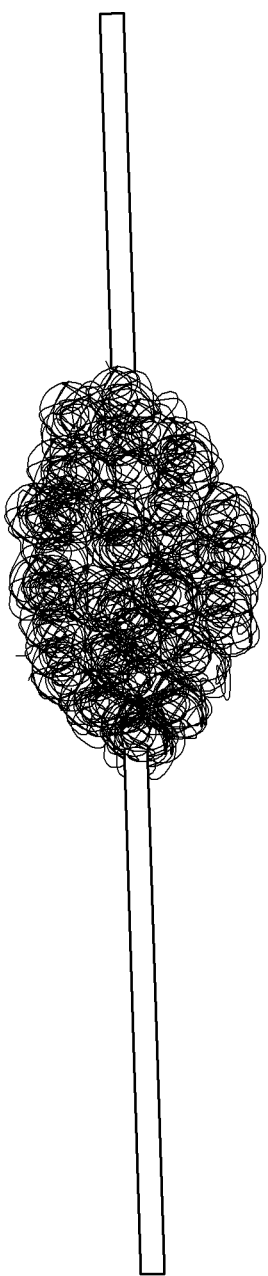
Figure 1E:
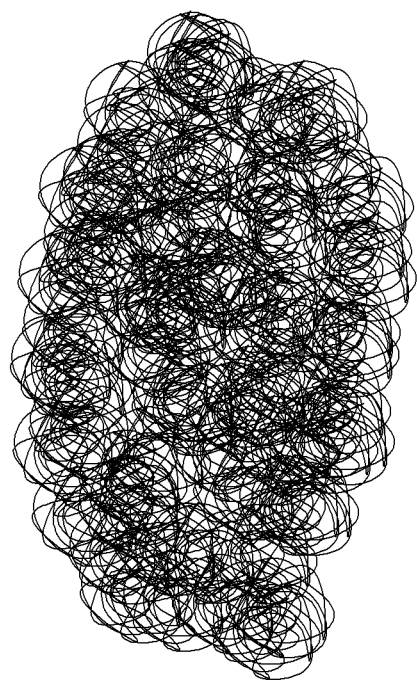
Figure 1F:
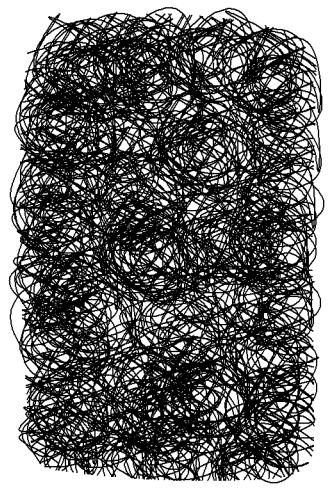

First, after a wire formed of polymer (FIG. 1A) is wound on a rod, ends of the wire are fixed by bolts (FIG. 1B). Further, after the wire is heated for 15 minutes at a temperature of 160° C., the bolts are untightened and the rod is removed, so that the wire is changed to have a shape of a coil (FIG. 1C). The wire having the shape of a coil is entangled around the rod (FIG. 1D) and is thus changed to have a shape of a ball having a non-compact interior. Next, after the rod is removed (FIG. 1E) and the wire is inserted into between compression dies, when pressure is applied to the wire for 60 minutes at the temperature of 160° C., the wire is changed to have a cylindrical structure as illustrated in FIG. 1F. That is, a structure in which one wire is complexly entangled inside the cylindrical structure may be formed.

As described above, the manufactured material is formed by entangling one wire and is characterized to have a Poisson's ratio that is not less than 0.5 A general material has a Poisson's ratio of 0-0.5, and rubber, which is considered to have a high Poisson's ratio, also has a Poisson's ratio of 0.46-0.49.

The Poisson's ratio refers to a ratio of a transverse strain to a horizontal strain that are caused by a normal stress generated inside a material, and the fact that the Poisson's ratio is increased means that when an axial load is applied, a widthwise strain is larger than a change in a lengthwise strain.

To generate a large amount of heat transfer in the same material, the area of the structure to which heat is transferred should become larger, and the thickness of the structure, which corresponds to a distance by which heat is transferred, should become smaller. This may be identified even by Equation (1) that is related to a heat transfer rate.

$$q = k\frac{A}{L}\Delta T \quad (1)$$

Herein, k denotes a heat transfer rate (W/m·K), A denotes an area ($m^2$), L denotes a length (m), and T denotes a temperature (K).

The heat transfer is increased as the area A becomes larger and the length L becomes smaller, as represented by Equation (1).

In the embodiment, the structure manufactured as described above is utilized as a means for mediating the heat transfer, and characteristics of the structure which may improve the heat transfer as described above will be described in more detail.

Figure 2A:
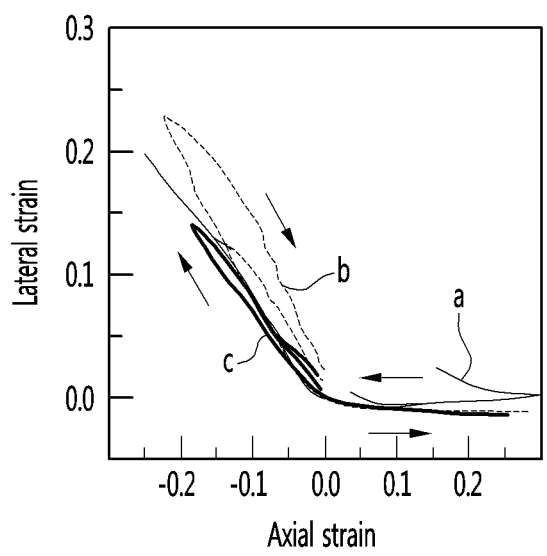
FIGS. 2A and 2B are graphs depicting characteristics of the heat transfer material according to the embodiment.
Figure 2B:
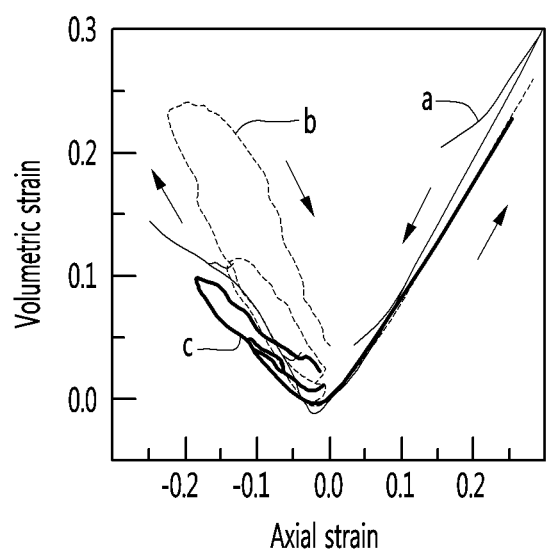
Figure 3:
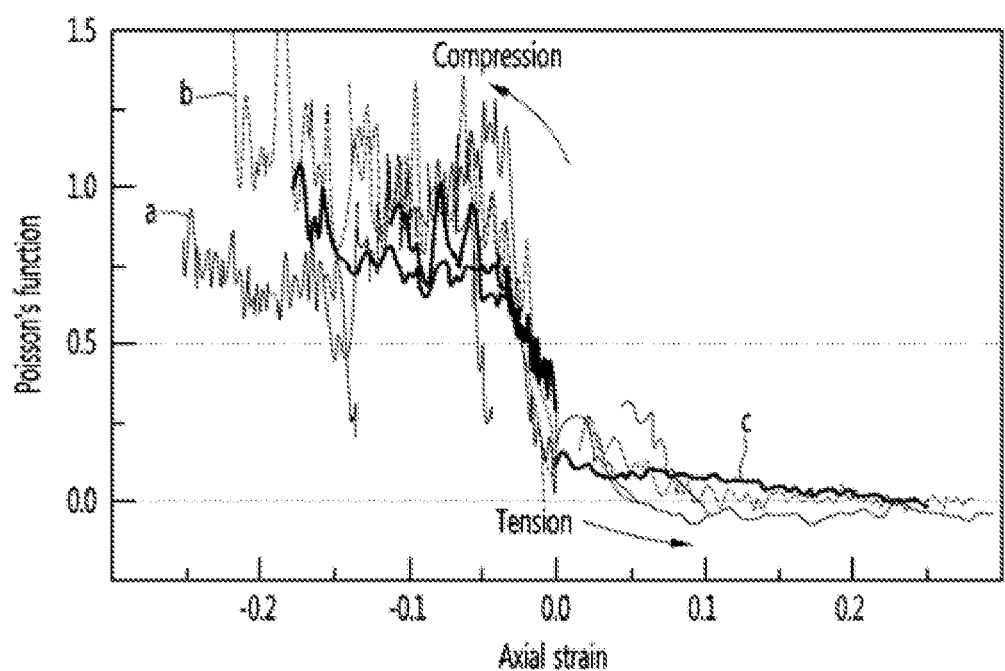
FIG. 3 is a graph depicting characteristics of the heat transfer material according to the embodiment.

FIGS. 2A and 2B are graphs depicting characteristics of the heat transfer material according to the embodiment. It is preferred that a single wire is formed of copper, nitinol, polymer or the like. In the graphs of FIGS. 2A to 3, a denotes copper, b denotes nitinol, and c denotes polymer. The graphs are obtained by measuring strains of the structure while a cycle is performed in which the structure is repeatedly compressed or decompressed (tensioned) in an axial direction thereof.

FIG. 2A is a graph depicting a lateral strain for an axial strain, and FIG. 2B is a graph depicting a volumetric strain for the axial strain. Referring to FIG. 2A, it can be identified that the lateral strain has a positive value when the structure is compressed (when the axial strain has a negative value), and it can be understood through this that a heat transfer structure is expanded in a lateral direction thereof.

Referring to FIG. 2B, although it is considered that the volumetric strain should have a negative value in a state in which the structure is compressed, the volumetric strain has a positive value. Such an increase in the volume of the structure implies volumetric expansion resulting from the compression. Further, most of the volumetric expansion is restored to a normal state when the wire structure in which polymer (PA) or nitinol (NiTi) are entangled is decompressed.

FIG. 3 is a graph depicting characteristics of the heat transfer material according to the embodiment, which depicts Poisson's function values for the axial strain. A change in the volume of the structure may be represented by a Poisson's function. It can be identified that the Poisson's function has symmetric distribution according to a compression/tension state. In case of the compression, a Poisson's function value for nitinol and polymer is increased to exceed 1, and a Poisson's function value for copper is 1.75 which is slightly lower than 1. However, nitinol, polymer and copper have similar tendency. In case of the tension, a Poisson's function value for nitinol and polymer is gradually converged to 0, and a Poisson's function value for copper is negative.

As described above, when axial compressive force is applied to the structure formed by entangling the wire formed of any one of copper, nitinol and the polymer, a Poisson's function value for the structure approaches 1, which implies that the structure is sharply expanded in a lateral direction thereof and is sharply contracted in a lengthwise direction thereof. Due to such characteristics of the structure, the structure may serve as a medium that may improve a heat transfer rate, as indicated by Equation (1).

Figure 4:
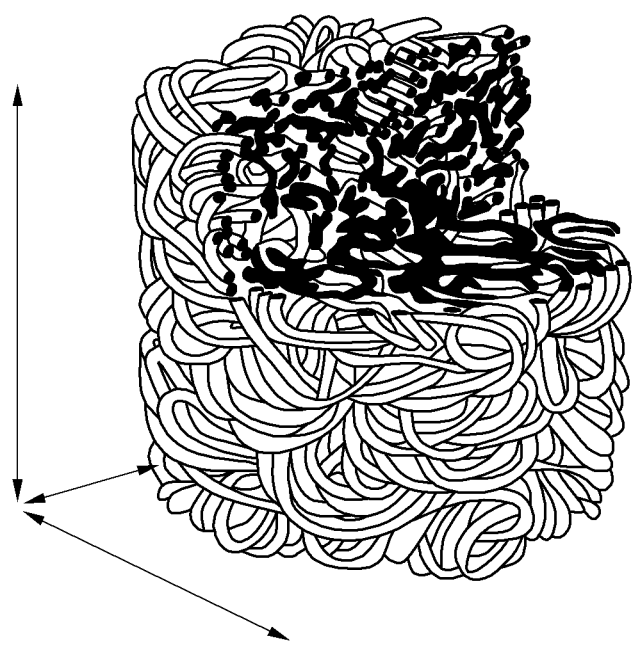
FIG. 4 is a view illustrating an example of a heat transfer structure that is to be applied as a heat transfer medium.

FIG. 4 is a view illustrating an example of the heat transfer structure that is to be applied as a heat transfer medium. Referring to FIG. 4, a structure having a cylindrical shape having a diameter L and a height H, in which a wire having a shape of a coil is disorderly entangled, is disclosed. Although the structure is obtained by entangling a single wire having a length of 20 m and the diameter of the wire is 500 μm, the present disclosure is not limited thereto. Further, the wire may be formed of any one of copper, nitinol and polymer.

Figure 5:
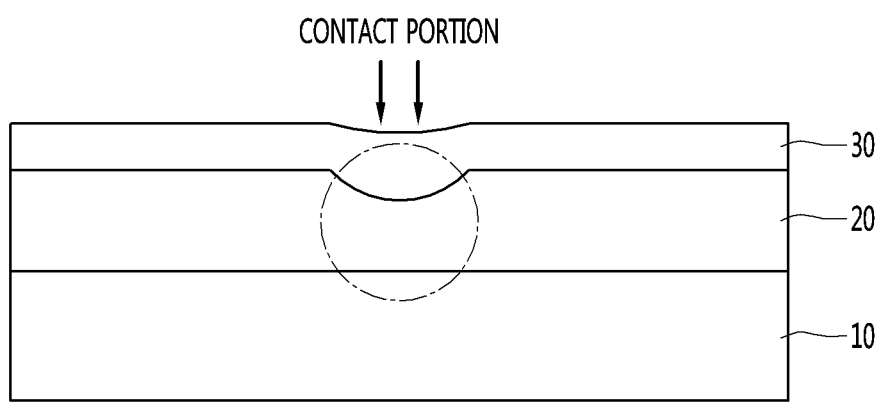
FIG. 5 is a view illustrating the heat transfer device according to the embodiment.

FIG. 5 is a view illustrating the heat transfer device according to the embodiment.

Referring to FIG. 5, the heat transfer device according to the embodiment may include a heat generating device 10 configured to generate heat having predetermined intensity by a user, a cover 30 in contact with a body of the user while covering the heat generating device 10, and a heat transfer medium 20 provided between the heat generating device 10 and the cover to transfer the heat generated by the heat generating device 10.

Although the heat generating device 10 may be an electric heating wire configured to generate heat by electric power, the present disclosure is not limited thereto, and the heat generating device 10 may include all structures configured to generate heat. Further, when the body of the user comes into contact with the heat transfer medium 20, a weight of the user is transferred to a structure constituting the heat transfer medium 20, the shape of a portion of the structure, to which the weight is transferred, may be changed.

The heat transfer medium 20 may be a structure in which a single wire having a predetermined length is entangled to have reversible dilatancy. That is, due to pressure applied by the contact of the user, the thickness of the structure is reduced and the length and the width of the structure is increased. Thus, a heat transfer rate at the contact portion may be increased as illustrated in FIG. 5.

When a portion of the structure, which is in contact with the body of the user, is large, that is, when an area of the heat generating device is large, the heat transfer medium 20 may be integrally formed by adjusting the length of the wire. The integrated structure may be formed by designing the size of dies that finally apply pressure when the entangled wire structure is manufactured, to correspond to the area of the heat generating device 10.

Further, the heat transfer medium 20 may have a structure in which a plurality of structures are arranged and may be formed by partially arranging the heat transfer structure only in a portion which is frequently in contact with the body.

It is preferred that the cover 30 is formed of a material having high elasticity to transfer pressure to the heat transfer medium 20 when a portion of the body of the user is in contact with the cover 30, while covering the heat transfer medium 20.

Figure 6A:
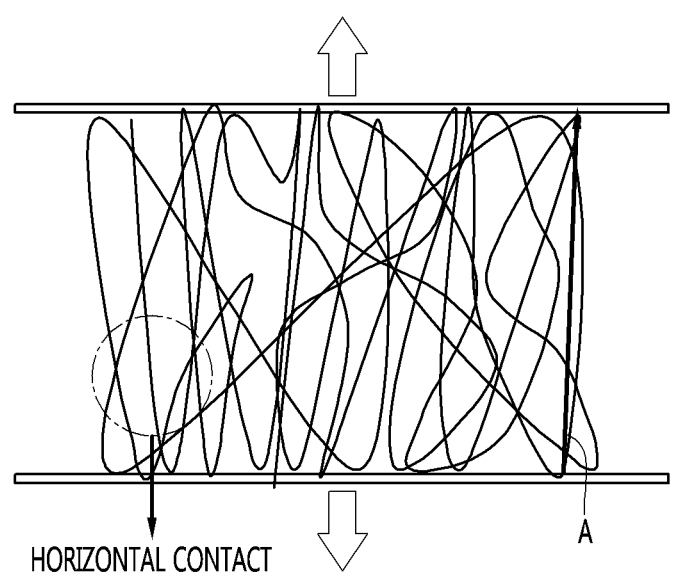
FIGS. 6A and 6B are views illustrating changes of a heat transfer path of the heat transfer device according to the embodiment.
Figure 6B:
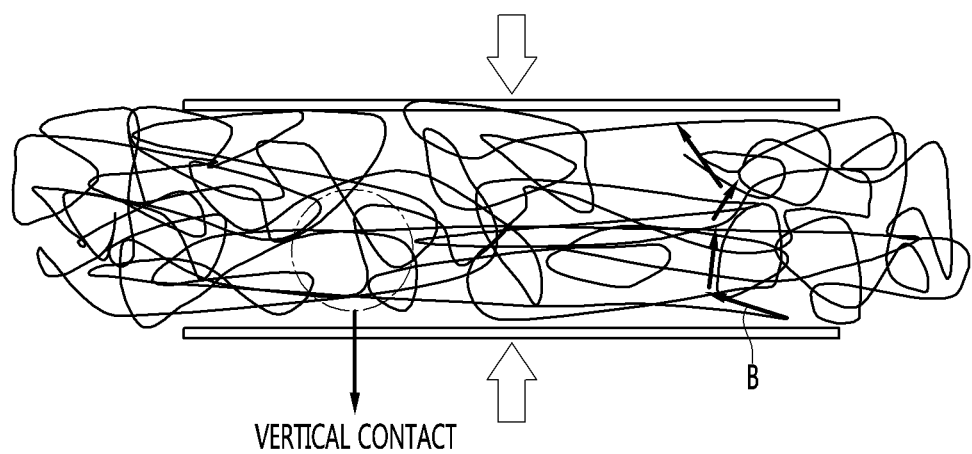

FIGS. 6A and 6B are views illustrating changes of a heat transfer path of the heat transfer device according to the embodiment.

Referring to FIGS. 6A and 6B, FIG. 6A illustrates a case where the heat transfer medium is tensioned, and FIG. 6B illustrates a case where the heat transfer medium is compressed. Referring to FIG. 6A, when the heat transfer medium is tensioned in a vertical direction as in a direction of arrows, the entangled wire constituting the heat transfer medium is in a state in which horizontal contact between portions of the wire is dominant, and in this case, the heat transfer path may be represented by an arrow A.

Referring to FIG. 6B, when the heat transfer medium is compressed in a direction of arrows, the entangled wire constituting the heat transfer medium is in a state in which vertical contact between portions of the wire is dominant, and in this case, the heat transfer path may be represented by arrows B.

That is, if it is assumed that the heat transfer medium emits heat along the heat transfer path corresponding to the arrow A when there is no contact with the user, the entangled wire structure is deformed at a portion of the heat transfer medium, to which pressure is applied by contact with the user, so that the heat transfer path may be changed to the arrows B. Because the wire structure is expanded in a radial direction thereof and the volume thereof is thus increased, a heat transfer area is increased. Further, because the heat transfer path corresponding to the arrows B is shorter than the heat transfer path corresponding to the arrow A, thermal resistance is reduced. Because of this, the contact portion may rapidly transfer heat to the user as compared with other portions. Further, when the applied pressure is removed, the shape of the heat transfer medium is restored to an original state thereof, and the heat transfer path may be changed to the arrow A again.

When a case where the heat transfer device according to the embodiment is applied to a car seat is described as an example, the car seat for a vehicle is a member provided to rapidly increase the body temperature of a driver or a passenger particularly in winter. Inside the car seat, a heat wire configured to generate heat may be provided in a zigzag form and a heat transfer medium in contact with the heat wire and a cover configured to cover the same may be provided.

When a user sits in the car seat, a portion of the car seat, which is in contact with a body of the user, may rapidly transfer heat to a contact portion of the user due to a decrease in the thickness of the wire structure constituting the heat transfer medium and an increase in the area of the wire structure, which are result from pressure.

Further, when the user does not sit in the car seat, the thickness of the heat transfer medium is increased and the area of the heat transfer medium is decreased. Thus, heat transferred through a heat generating device stays in the heat transfer medium so that internal heat does not easily escape and a certain temperature may be maintained.

As described above, the heat transfer device according to the present embodiment may be usefully applied to a structure to which pressure is applied by the contact with the user, such as a chair provided in a public transportation system such as a bus and a subway and a handle of a vehicle as well as the car seat of a vehicle.

As described above, in the embodiment, a structural change in the heat generating device is not required and only a material which is in contact with the heat generating device is changed, so that generated heat more rapidly reaches the body of the user.

Further, even when the heat generating device generates the same amount of heat, a portion of the heat generating device, pressure of which is changed by contact with a user, is changed to a structure that may preferentially and rapidly transfer heat, so that energy efficiency at the heat transfer may be improved.

Although exemplary embodiments of the present disclosure have been mainly described above, the embodiments are merely illustrative and do not limit the present disclosure. Further, it will be apparent to those skilled in the art to which the present disclosure pertains that various modifications and applications may be made without departing from the essential feature of the present disclosure. For example, components described in the embodiments of the present disclosure in detail may be implemented by modification. Further, it should be interpreted that differences related to the modifications and the applications are included in the scope of the present disclosure, which is defined by the appended claims.

The present disclosure relates to a heat transfer device in which heat transfer is rapidly performed at a portion of the heat transfer device, pressure of which is changed at a point thereof in contact with a portion of a body of a user, and because only a material in contact with a heat generating device is changed and generated heat rapidly reaches the body of the user, energy efficiency is improved, so that it is determined that industrial availability is high.

What is claimed is:
1. A heat transfer device comprising:
a heat generating device configured to generate heat having predetermined intensity by a user;
a cover in contact with a body of the user while covering the heat generating device; and
a heat transfer structure provided between the heat generating device and the cover to transfer the heat generated by the heat generating device,
wherein the heat transfer structure is formed by entangling a single wire having a predetermined length,
wherein the heat transfer structure has a predetermined width and a predetermined height, wherein the heat transfer structure has a Poisson's ratio of 0.5 or higher, when the heat transfer structure is compressed in an axial direction by pressure applied by contact of the body, wherein, at a portion of the heat transfer structure, to which pressure is applied by contact with the user, a volume increase, a heat transfer area increase, and heat transfer is faster than other portions, in accordance with the portion of the heat transfer structure being expanded in a radial direction, wherein the Poisson's ratio of the heat transfer structure increase, when the heat transfer structure is compressed in the axial direction by pressure applied by contact of the body, wherein a strain in a widthwise direction is larger than a strain in a lengthwise direction, when the heat transfer structure is compressed in the axial direction and the Poisson's ratio of the heat transfer structure is increased wherein the single wire is formed of any one of copper, nitinol and polymer, wherein the heat transfer structure is formed as the single wire is wound on a rod, the single wire having the shape of a coil is entangled around the rod and is changed to have a shape of a ball having a non-compact interior, the rod is removed from the single wire having the shape of the ball, and the single wire having the shape of the ball is compressed to have a cylindrical structure.

2. The heat transfer device of claim 1, wherein a plurality of heat transfer structures are arranged in a portion of the heat transfer device, which is in contact with the body of the user.

3. The heat transfer device of claim 1, wherein the wire has a diameter of 500 μm and is a single wire having a length of 20 m.

4. The heat transfer device of claim 1, wherein when the heat transfer structure is compressed, the thickness of the heat transfer medium is decreased and an area of the heat transfer structure, which is in contact with the heat generating device, is increased.

5. The heat transfer device of claim 4, wherein a heat transfer path at a portion of the heat transfer structure, which is compressed, is shorter than a heat transfer path at a portion of the heat transfer structure, which is not compressed.

6. The heat transfer device of claim 1, wherein when the heat transfer structure is tensioned, the Poisson's ratio of the heat transfer structure is close to 0, the thickness of the heat transfer structure is increased, and an area of the heat transfer structure, which is in contact with the heat generating device, is decreased.

7. The heat transfer device of claim 1, wherein when the heat transfer structure is compressed and is then decompressed, heat stored in the heat transfer structure is maintained at a certain level while the heat transfer structure is restored to an original shape.

* * * * *